(12) United States Patent
Alpert et al.

(10) Patent No.: US 9,047,436 B2
(45) Date of Patent: Jun. 2, 2015

(54) COMPUTER-BASED MODELING OF INTEGRATED CIRCUIT CONGESTION AND WIRE DISTRIBUTION FOR PRODUCTS AND SERVICES

(71) Applicant: International Business Machines Corporation, Armonk, NY (US)

(72) Inventors: Charles J. Alpert, Austin, TX (US); Zhuo Li, Cedar Park, TX (US); Chin Ngai Sze, Austin, TX (US); Jia Wang, Sunnyvale, CA (US); Yaoguang Wei, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/085,285

(22) Filed: Nov. 20, 2013

(65) Prior Publication Data

US 2015/0113491 A1    Apr. 23, 2015

Related U.S. Application Data

(63) Continuation of application No. 14/059,801, filed on Oct. 22, 2013, now Pat. No. 8,949,762.

(51) Int. Cl.
    *G06F 17/50* (2006.01)
(52) U.S. Cl.
    CPC ................ *G06F 17/5081* (2013.01)
(58) Field of Classification Search
    CPC ....................................................... G06F 17/50

USPC ........................................................ 716/126
See application file for complete search history.

(56) References Cited

U.S. PATENT DOCUMENTS

| | | | |
|---|---|---|---|
| 7,299,442 B2 * | 11/2007 | Alpert et al. | ........... 716/129 |
| 7,707,536 B2 | 4/2010 | Lin et al. | |
| 2002/0107711 A1 | 8/2002 | Xing et al. | |
| 2009/0092144 A1 | 4/2009 | Wepiwe et al. | |
| 2010/0023913 A1 | 1/2010 | Cohn et al. | |
| 2012/0206463 A1 | 8/2012 | Reid et al. | |
| 2012/0269191 A1 | 10/2012 | Khanduri | |

OTHER PUBLICATIONS

Chang et al., "NTHU—Route 2.0: A Fast and Stable Global Router", ICCAD, 2008, pp. 1-6.
Chen et al., "High-Performance Global Routing with Fast Overflow Reduction", IEEE, 2009, pp. 582-587.
Cho et al., "BoxRouter 2.0: Architecture and Implementation of a Hybrid and Robust Global Router", IEEE, 2007, pp. 503-508.
Dai et al., "Efficient Simulated Evolution Based Rerouting and Congestion Relaxed Layer Assignment on 3-D Global Routing", IEEE, 2009, pp. 570-575.

(Continued)

*Primary Examiner* — Thuan Do
(74) *Attorney, Agent, or Firm* — Cantor Colburn LLP; William Stock

(57) ABSTRACT

A computer-based system and method for modeling integrated circuit congestion and wire distribution determines a boundary where a tile congestion corresponding to a first layer group is equivalent to a first blockage ratio corresponding to a second layer group, formulates a piece-wise linear formula that relates the tile congestion to a number of wires of a two-dimensional tile, and distributes a portion of the number of wires to a layer of the tile based on the tile congestion.

8 Claims, 4 Drawing Sheets

(56) References Cited

OTHER PUBLICATIONS

Gester et al., "BonnRoute: Algorithms and Data Structures for Fast and Good VLSI Routing", ACM Transactions on Design Automation of Electronic Systems, vol. 18, No. 2, Article 32, Mar. 2013, pp. 1-24.

Moffitt, "MaizeRouter: Engineering an Effective Global Router", IEEE, 2008, pp. 226-231.

Moffitt et al., "Wire Synthesizable Global Routing for Timing Closure", IEEE, 2011, pp. 545-550.

Ozdal et al., "ARCHER: A History-driven Global Routing Algorithm", IEEE, 2007, pp. 488-495.

Pan et al., "FastRoute 2.0: A High-quality and Efficient Global Router", IEEE, 2007, pp. 250-255.

Pan et al., "FastRoute: An Efficient and High-Quality Global Router", Hindawi Publishing Corporation, VLSI Design, 2012, pp. 1-18.

Roy et al., "High-Performance Routing at the Nanometer Scale", TCAD, 2008, pp. 1066-1077.

Wu et al., "A Parallel Integer Programming Approach to Global Routing", DAC, 2010, pp. 194-199.

U.S. Appl. No. 14/059,801; NonFinal Office Action; filed Oct. 22, 2013; Date Mailed: Jun. 12, 2014; 11 pages.

* cited by examiner

COMPUTER-BASED MODELING OF INTEGRATED CIRCUIT CONGESTION AND WIRE DISTRIBUTION FOR PRODUCTS AND SERVICES

CROSS-REFERENCE TO RELATED APPLICATIONS

The present application is a Continuation of U.S. patent application Ser. No. 14/059,801, entitled "COMPUTER-BASED MODELING OF INTEGRATED CIRCUIT CONGESTION AND WIRE DISTRIBUTION FOR PRODUCTS AND SERVICES", filed on Oct. 22, 2013, which is incorporated herein by reference in its entirety.

BACKGROUND

The present invention relates to integrated circuit wire routing, and more specifically, to a method for modeling integrated circuit congestion and wire distribution in three dimensions (3D) using two-dimensional (2D) global routing.

Routing of wires on an integrated circuit (IC) is an important VLSI (very large integrated circuit) design phase. A two-step approach to routing has often been implemented in which an initial global routing solution is followed by a detailed routing solution. Global routing may define routing regions over the integrated circuit, generate tentative routes for each net from a driver to a receiver, and assign each tentative net to a set of routing regions. Actual placement of wires, layout of routing tracks and assignment of wires to specific tracks is performed during the subsequent detailed routing.

Global routing may include two-dimensional (2D), computer-based modeling of congestion, that is, blockage of tracks. Blockage may include, for example, tracks previously assigned or used at a lower level of the design hierarchy, so-called "third-party IP," contacts to and from lower or higher hierarchies, and pre-routed wires (for example, wires predetermined as power wires).

During global routing, all layers of a multilayered integrated circuit may be segregated into a continuous 2D array of "tiles," or global routing cells ("Gcells") for the purpose of creating a mathematical model of the integrated circuit wiring. However, the results of 2D modeling regarding congestion has not been accurate.

As a result, three-dimensional (3D) modeling regarding congestion in multiple layers of an integrated circuit has been required during the detailed routing phase in order to provide a sufficiently accurate model for detailed design purposes. However, 3D modeling requires the use of relatively complicated algorithms that are require relatively high usage of computational resources.

SUMMARY

According to one embodiment of the present invention, a system for modeling circuit congestion includes a boundary locator that determines a boundary where a tile congestion corresponding to a first layer group is equivalent to a first blockage ratio corresponding to a second layer group, and a congestion estimator that formulates a segment of a piece-wise linear formula relating the tile congestion to a number of wires of a two-dimensional tile.

According to another embodiment of the present invention, a computer program product for modeling circuit congestion includes a computer readable storage medium having stored thereon first program instructions executable by a processor to cause the processor to determine a boundary where a tile congestion corresponding to a first layer group is equivalent to a first blockage ratio corresponding to a second layer group, and second program instructions executable by the processor to cause the processor to formulate a segment of a piece-wise linear formula that relates the tile congestion to a number of wires of a two-dimensional tile.

According to another embodiment of the present invention, a method for modeling circuit congestion includes determining, with a processing device, a boundary where a tile congestion corresponding to a first layer group is equivalent to a first blockage ratio corresponding to a second layer group, and formulating a segment of a piece-wise linear formula that relates the tile congestion to a number of wires of a two-dimensional tile.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

An embodiment in accordance with the present invention implements an algorithm requiring relatively low usage of computational resources that may permit relatively accurate modeling of congestion, and thus, wire distribution, over a multilayered integrated circuit during 2D global routing. The implemented algorithm may derive series of closed form equations to formulate a 2D piece-wise linear function having a closed-form solution to formulate a congestion model that equals or relatively closely resembles a 3D congestion model. That is to say, the congestion values formulated by the 2D piece-wise linear function may be the same as, or relatively close to, the congestion values that may be formulated using a 3D routing model.

The resultant tile congestion may be used to determine an appropriate wire distribution for each layer of the multilayered integrated circuit. Thus, an embodiment of the present invention may provide a relatively fast method to model 3D routing resources in 2D global routing with relatively accurate results using relatively fewer computational resources than a 3D model, the results of which may be sufficiently accurate for use in detailed routing design and wire layout.

Figure 1:
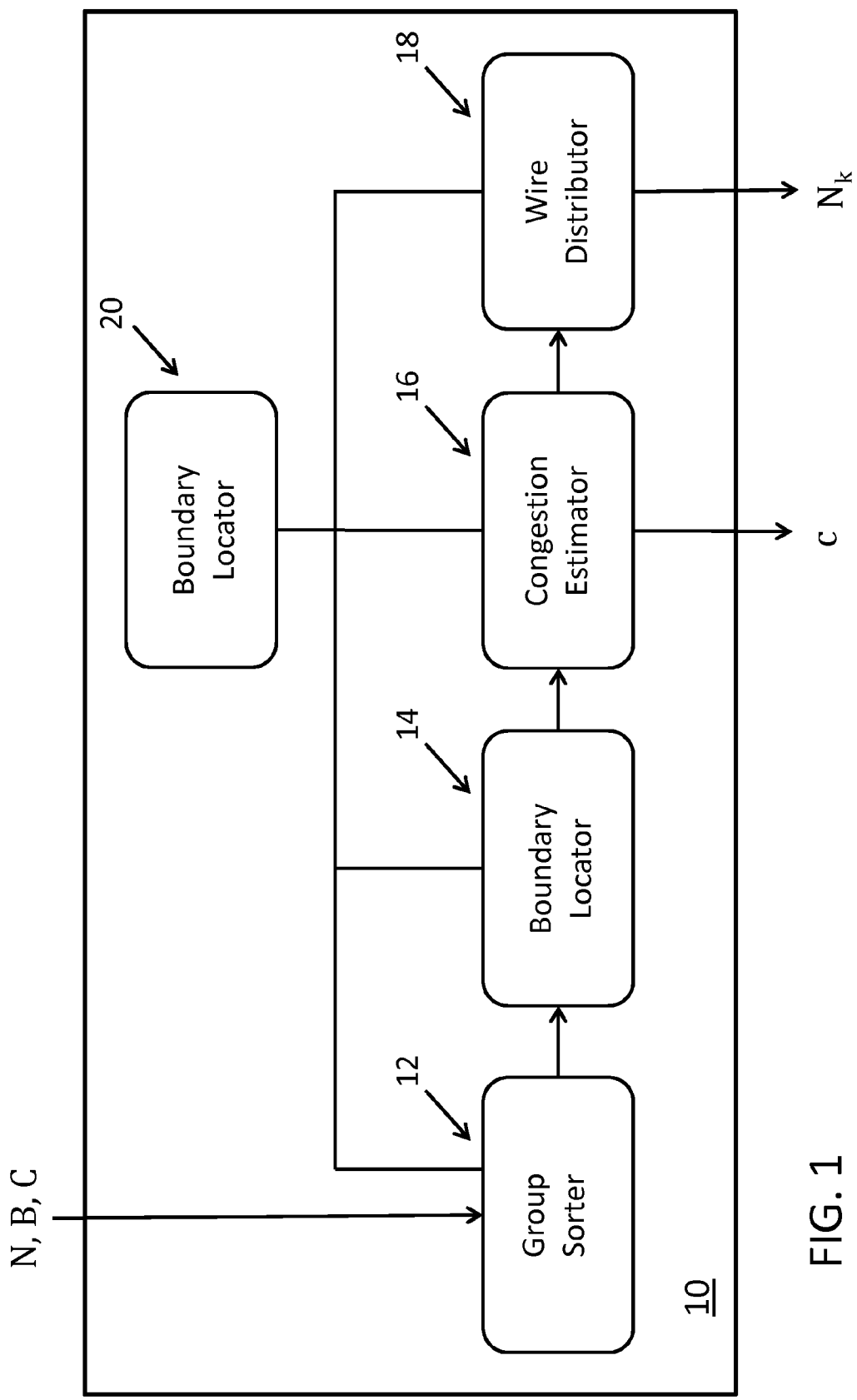
FIG. 1 is a schematic diagram of an apparatus for modeling integrated circuit congestion and wire distribution in accordance with an embodiment of the invention.

With reference now to FIG. 1, an embodiment in accordance with the present invention is shown. FIG. 1 is a schematic diagram of an apparatus for modeling integrated circuit congestion and wire distribution 10. The apparatus 10 may include a group sorter 12, a boundary locator 14, a congestion estimator 16, a wire distributor 18 and a processor 20.

The apparatus 10 may receive input information, such as, for example, the total number (N) of wires crossing the edge of each tile, or Gcell; the capacity ($C_k$), or the maximum number of tracks that potentially may be placed on each layer of each tile; and the blockage ($B_k$), or the number of unavailable tracks associated with each layer of each tile.

The group sorter 12 may compute the blockage ratio for each layer corresponding to a tile, and group together tile layers based on the equivalence or proximity of the layer blockage ratios. The blockage ratio for each layer may be computed as follows:

$$\text{layer blockage ratio} = \frac{\text{layer blockage}}{\text{layer capacity}} \quad (1a)$$

or $$p = \frac{B_k}{C_k}, \quad (1b)$$

where
  k is the corresponding layer,
  $B_k$ is the blockage of layer k (number of blocked tracks), and
  $C_k$ is the capacity of layer k (maximum number of tracks).

Thus, the number of groups may be equal to or less than, but never greater than, the number of layers in the tile. The group sorter 12 may further order the resulting groups with regard to blockage ratio, for example, from lowest blockage ratio to highest blockage ratio.

The boundary locator 14 may then determine boundary points along a piece-wise linear function that represents the total congestion (c) of the tile as a function of the total number of wires (N). Boundary points occur where the congestion of each successive group equals the blockage ratio of the next group, such that:

$$(\text{total no. wires})_{boundary} = \frac{(\text{total capacity of all lower groups})(\text{blockage of current group})}{\text{capacity of current group}} - \text{total blockage of all lower groups} \quad (2a)$$

or $$N_{q/(q-1)} = \frac{B_q \sum_{i=1}^{q-1} C_i}{C_q} - \sum_{i=1}^{q-1} B_i \quad (2b)$$

where
  $N_{q/(q-1)}$ is the total number of wires at the boundary point between segment q−1 and segment q,
  $B_q$ is the total blockage of the current group, and
  q is the current group,
  $C_q$ is the total capacity of the current group, and
  $B_i$ is the blockage of group i.

The congestion estimator 16 may then formulate the congestion for each segment of the piece-wise linear function points for which the total number of wires is less than or equal to the number of wires at the final boundary point, as follows:

$$(\text{Congestion})_{segment} = \frac{\text{total no. wires} + \text{total blockage of current and all lower groups}}{\text{total capacity of current and all lower groups}} \quad (3a)$$

or $$c_{segment} = \frac{N + \sum_{i=1}^{q} B_i}{\sum_{i=1}^{q} C_i} \quad (3b)$$

where
  c=congestion,
  q is the current group,
  N is the total number of wires crossing the edge of the tile,
  q is the current group,
  $B_i$ is the blockage of group i, and
  $C_i$ is the capacity of group i.

The congestion estimator 16 may then formulate the congestion for points at which the total number of wires is greater than the number of wires at the final boundary point, but less than or equal to the value of the total blockage subtracted from the total capacity, which forms a practical upper limit of the formula, may be computed as follows:

$$(\text{Congestion})_{segment} = \frac{\text{total no. wires} + \text{total blockage of all groups}}{\text{total capacity of all groups}} \quad (4a)$$

or $$c_{segment} = \frac{N + \sum_{i=1}^{m} B_i}{\sum_{i=1}^{m} C_i} \quad (4b)$$

where
  c=congestion,
  N is the total number of wires crossing the edge of the tile,
  m is the total number of groups,
  $B_i$ is the blockage of group i, and
  $C_i$ is the capacity of group i.

The wire distributor 18 may then determine the appropriate number of wires to be placed on each layer of the tile according to the following:

$$N_k = (\text{congestion})(\text{layer capcity}) - \text{layer blockage} \quad (5a)$$

or $$N_k = cC_k - B_k \quad (5b)$$

where
  $N_k$ is the number of wires crossing the edge of the tile at layer k, c=congestion,
$C_k$ is the capacity of layer k, and
$B_k$ is the total blockage of layer k.

Figure 2:
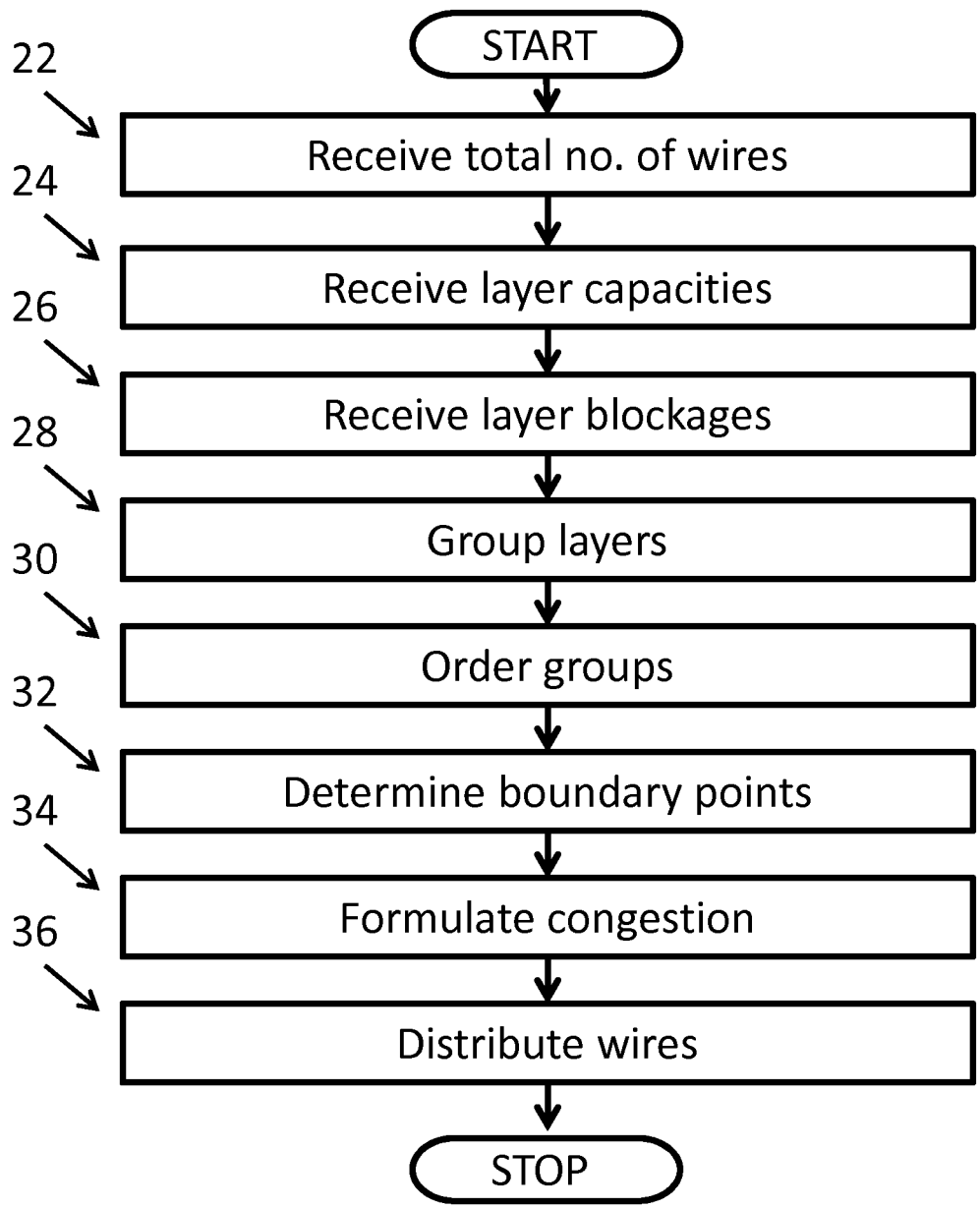
FIG. 2 is a block diagram of a method for modeling integrated circuit congestion and wire distribution in accordance with an embodiment of the invention.

FIG. 2 is a block diagram depicting a method for modeling integrated circuit congestion and wire distribution in accordance with an embodiment of the present invention. In block 22, the total number of wires associated with a tile, or Gcell, such as for example, the total number of wires crossing the edge of the tile at all layers, may be received.

A value or values corresponding to the capacity associated with each layer of the tile, such as, for example, the maximum number of tracks that may be placed on each layer of the tile while conforming to all design constraints associated with each layer, may be received in block 26. A value or values corresponding to the blockage associated with each layer of the tile, such as, for example, the number of tracks not available because the tracks have been previously reserved or allocated in another level of the design hierarchy (for example, predetermined tracks assigned as power wires or third-party intellectual property [IP]), may be received in block 26.

In block 28, the layers of the tile may be grouped together with similar or associated layers. For example, layers with equivalent or otherwise relatively similar blockage ratios, as represented by the ratio of the number of blocked, or unavailable, tracks to the capacity, may be integrated or grouped together to form groups of layers having the same or similar level of blockage. The groups may be ordered, for example, from the group of layers having the lowest blockage ratios to the group of layers having the highest blockage ratios, in block 30.

In block 32, the boundary points of the piece-wise linear formula corresponding to the congestion of the various groups with respect to the total number of wires may be determined in accordance with Equation (2a) or Equation (2b) above. In block 34, the congestion corresponding to each segment of the piece-wise linear formula between the boundary points may be formulated in accordance with Equation (3a) or Equation (3b), and Equation (4a) or Equation (4b) above. In block 36, the wire distribution may be allocated among the various layers in accordance with Equation (5a) or Equation (5b) above.

As a specific example of an application of the embodiment of FIG. 2, consider an integrated circuit composed of five layers: layer A, layer B, layer C, layer D and layer D. In this example, for the purpose of modeling congestion and wire distribution, the integrated circuit is divided into an array of multiple contiguous segments in a 2D plane, including a particular tile, or Gcell, to be evaluated.

In block 22, the predetermined total number of wires crossing the edge of the tile, N=38, is received. The capacities associated with each layer of the tile are received in block 24, as follows: $C_A$=50, $C_B$=40, $C_C$=20, $C_D$=20, and $C_E$=10. The blockages associated with each layer of the tile are received in block 26, as follows: $B_A$=30, $B_B$=20, $B_C$=0, $B_D$=0, and $B_E$=5.

In block 28, the layers are grouped together into groups according to the blockage ratios of the various layers. The blockage ratios are computed according to Equation (1a) or Equation (1b) above: $p_A$=60%, $p_B$=50%, $p_C$=0%, $p_D$=0%, and $p_E$=50%. As a result, layer A is grouped by itself, because no other layer has a blockage ratio of about 60%; layer B and layer E are grouped together, because their respective blockage ratios are equivalent (50%); and layer C and layer D are grouped together, because their respective blockage ratios are equivalent (0%).

Thus, the total capacities of the groups are $C_1$=40, $C_2$=50, and $C_3$=50, and the total blockages of the groups are $B_1$=0, $B_2$=25, and $B_3$=30.

The resulting groups are then ordered, in block 30, from the lowest blockage ratio to the highest blockage ratio: Group 1 (including layer C and layer D, with blockage ratios of 0%), Group 2 (including layer B and layer E, with blockage ratios of 50%), and Group 3 (including only layer A, with a blockage ratio of 100%). In block 32, the boundary points of the piece-wise linear function corresponding to are determined according to Equation (2a) or (2b), as follows:

$$N_{1/0} = \frac{B_2 C_1}{C_2} - B_1 = 20, \text{ and}$$

$$N_{2/1} = \frac{B_3(C_1 + C_2)}{C_3} - (B_1 + B_2) = 29.$$

Congestion along each segment of the piece-wise linear function is formulated, in block 34, according to Equation (3a) or Equation (3b), and Equation (4a) or Equation (4b), as follows:

$$c = \frac{N + B_1}{C_1} = \frac{N}{40}$$

when $0 < N \le 20$, $$c = \frac{N + B_1 + B_2}{C_1 + C_2} = \frac{N + 25}{90}$$

when $20 < N \le 29$, and $$c = \frac{N + B_1 + B_2 + B_3}{C_1 + C_2 + C_3} = \frac{N + 55}{140}$$

when $29 < N \le 85[=(C_1+C_2+C_3)-(B_1+B_2+B_3)]$.

Figure 3:
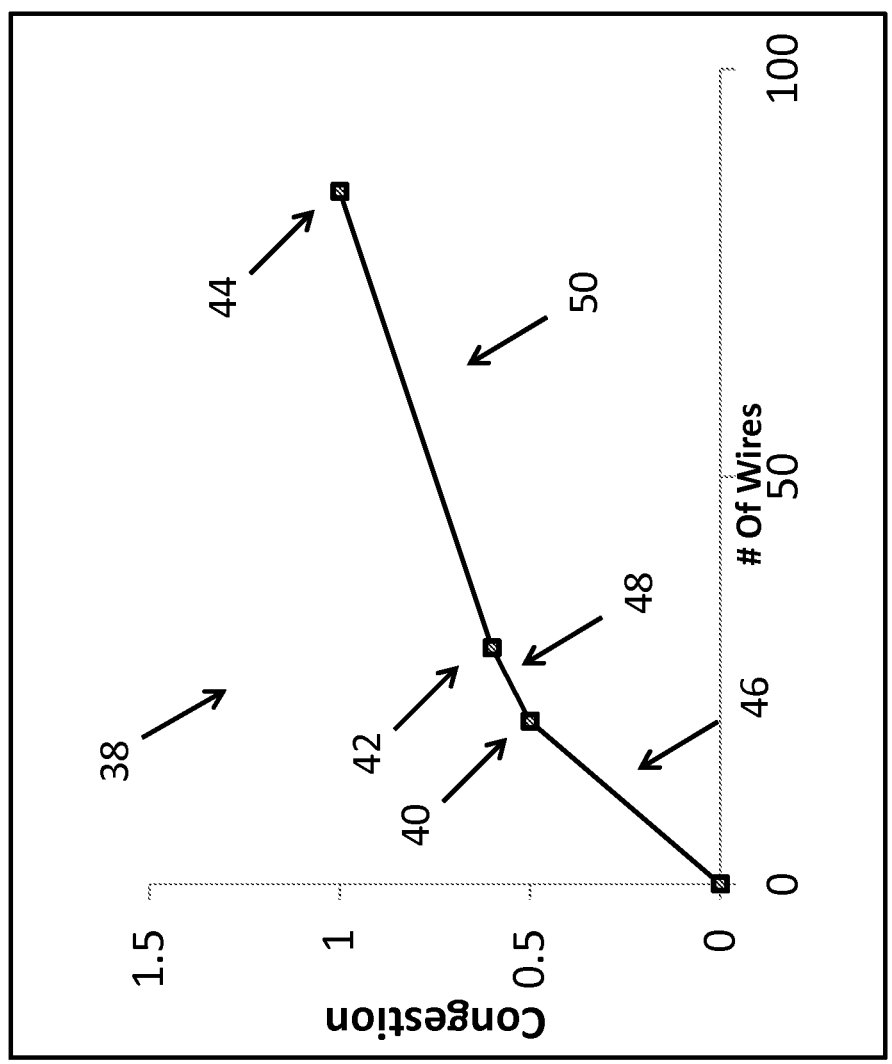
FIG. 3 is a graphical representation of an illustrative piece-wise linear formula relating circuit congestion to the total number of wires on a tile.

FIG. 3 is a graphical representation of the piece-wise linear function 38 that results from the above example formulation. The first boundary point 40 corresponds to N=20, at which point congestion is 0.5, and the second boundary point 42 corresponds to N=29, at which point congestion is 0.6. The upper boundary 44 of the piece-wise linear function 38 is 85, at which point congestion is 1.

The piece-wise linear function 38 consists of a series of linear segments. The first linear segment 46 extends from greater than zero through the first boundary point 40; the second linear segment 48 extends from greater than the first boundary point 40 through the second boundary point 42; and the third segment 50 extends from greater than the second boundary point 42 to the upper boundary 44 of the function 38.

Thus, for N=38 (received in block 22), the congestion of the tile is:

$$c = \frac{38 + 25}{90} = 0.7$$

The wire distribution is allocated among the various layers of the tile in accordance with Equation (5a) or Equation (5b) above, as follows:

$$N_A = (0.7)(40) - 30 = -2,$$

$$N_B = (0.7)(40) - 20 = 8,$$

$$N_C = (0.7)(20) - 0 = 14,$$

$$N_D = (0.7)(20) - 0 = 14, \text{ and}$$

$$N_E = (0.7)(10) - 5 = 2.$$

Where the result is less than zero, as in the case of $N_A$ above, no wires are assigned to the corresponding layer of the tile. Thus, in this example the wires are distributed among the layers as follows: 8 wires on layer B, 14 wires on layer C, 14 wires on layer D, and 2 wires on layer E, for a total of 38 wires, as required. This wire distribution will result in an even overall congestion level for all layers of the tile.

An embodiment of the present invention may further take into account specified layer directives or plane keywords, such as, for example, nets associated with layer traits or constraints. In this case, the congestion and wire distribution may be separately determined for the nets or wires associated with each layer directive or constraint condition, for example, considering only the wires associated with constrained nets on the specified range of layers indicated by the constraint condition. The allocated wires may subsequently be considered as blockage during modeling of the congestion and wire distribution regarding the remaining unconstrained wires.

Figure 4:
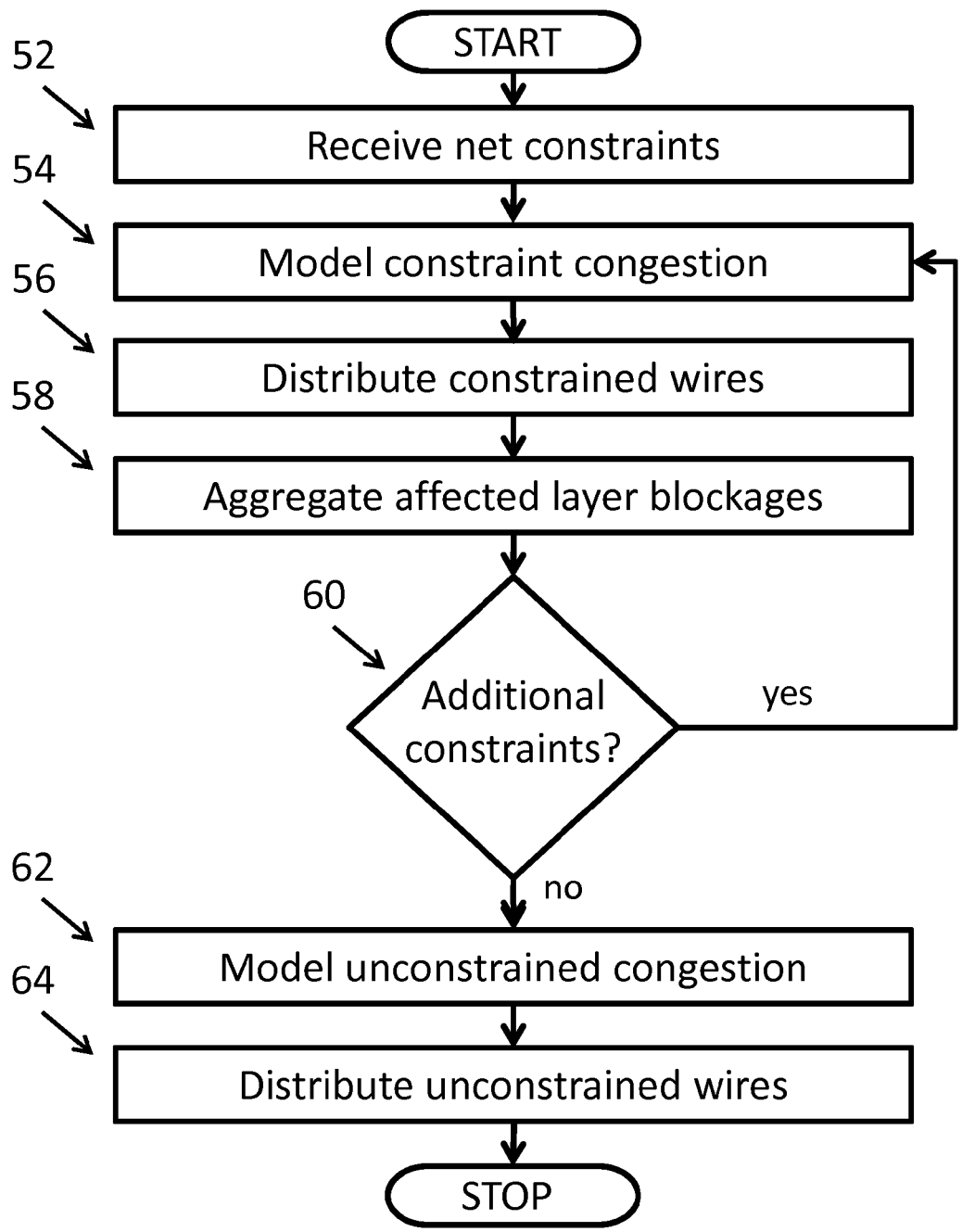
FIG. 4 is a block diagram of a method for modeling integrated circuit congestion and wire distribution in accordance with an embodiment of the invention.

FIG. 4 is a block diagram that outlines a method for modeling circuit congestion and wire distribution with respect to an integrated circuit that includes some constrained nets. Information regarding the net constraints, such as, for example, layer directives or plane keywords, may be received in block 52. In block 54, the congestion of the wires associated with a particular constraint, or constraint congestion, may be modeled in accordance with the method of FIG. 2, blocks 22 through 34. In block 56, the wires associated with a particular constraint may be distributed among the affected layers in accordance with the method of FIG. 2, block 36.

Since constraints with regard to higher layers typically may have higher priority, for example, the wires associated with constraints regarding higher layers may be modeled before those regarding lower layers. That is, the constraints may be ordered from those affecting relatively high layers of the tile through those affecting relatively low layers of the tile, and wires associated with each constraint may be modeled in the determined order.

Wires that have been allocated or assigned to affected layers of the tile (in block 56) during the modeling of a particular constraint may be aggregated with the previously existing blockages of each layer, in block 58, and considered as blockage during subsequent modeling of additional constraints.

If additional constraints remain, in block 60, the wires associated with each remaining constraint may be separately modeled, returning to block 54 for each constraint. When the wires associated with all constraints have been modeled, and no additional constraints remain in block 60, the congestion with respect to all remaining unconstrained wires in the tile may be modeled, in block 62, in accordance with the method of FIG. 2, blocks 22 through 34. During the modeling of the remaining unconstrained wires in block 62, all previously allocated constrained wires may be considered as blockage.

In block 64, the remaining unconstrained wires may be distributed among all the layers of the tile in accordance with the method of FIG. 2, block 36.

As a specific example, in block 52 layer directives may be received indicating that nets associated with five wires are constrained to layer C and layer D of the tile in the previous example, and nets associated with ten other wires are constrained to layer B and layer C. In block 54, priority may be given to the constraint regarding higher layers, layer C and layer D, and the associated five wires may be modeled with respect to only the affected layers, layer C and layer D.

In block 56, the five wires may be distributed among layer C and layer D. Suppose, for example, that the resultant model indicates two of the associated wires are distributed to layer D and three of the associated wires are to be distributed to layer C. In block 58, the previously existing blockage of layer C may be increased by three, and the previously existing blockage of layer D may be increased by two, for subsequent modeling.

Since an additional constraint exists, in block 60, the congestion of the ten wires associated with the remaining constraint may be modeled, in block 54, with respect to only the affected layers, layer B and layer C. In block 56, the ten wires may be distributed among layer B and layer C. Suppose, for example, that the resultant model indicates that four of the associated wires are distributed to layer C, and six of the associated wires are distributed to layer B. In block 58, the previously existing blockage of layer B may be increased by six, and the previously existing blockage of layer C may be increased by four, for subsequent modeling.

Since no additional constraints remain in block 60, the congestion of the remaining unconstrained wires may be modeled in block 62. During this modeling, of course, the originally received blockage of layer B will have been increased by a value of six, the originally received blockage of layer C will have been increased by an aggregate value of seven, and the originally received blockage of layer D will have been increased by a value of two. In block 64, the unconstrained wires may be distributed among all layers of the tile.

In another embodiment of the present invention, congestion may have a different definition. For example, in a "relative" model, congestion may be defined as follows:

$$c = \frac{\text{wire}}{\text{capacity} - \text{blockage}}.$$

When constraints exist, the relative model may be treated in a similar manner to an "absolute" model above. That is, local congestion may be modeled as part of the wire in the numerator:

$$c = \frac{\text{wire} + \text{local congestion}}{\text{capacity} - \text{blockage}}.$$

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that may communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks. The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for modeling circuit congestion, comprising:
   determining, with a processing device, a boundary where a tile congestion corresponding to a first layer group is equivalent to a first blockage ratio corresponding to a second layer group; and
   formulating a segment of a piece-wise linear formula that relates the tile congestion to a number of wires of a two-dimensional tile, the segment comprising one of a plurality of segments of an integrated circuit, the segments reflecting an array of multiple contiguous segments in a two-dimensional plane;
   wherein the tile congestion corresponding to the segment of the piece-wise linear formula is equal to a sum of the number of wires, the first blockage ratio and the second blockage ratio divided by a total capacity corresponding to the first and second layer groups.

2. The method of claim 1, further comprising ordering the first layer group and the second layer group based on the first blockage ratio being greater than a second blockage ratio, wherein the first blockage ratio corresponds to the second layer group and the second blockage ratio corresponds to the first layer group.

3. The method of claim 1, further comprising:
   receiving a blockage corresponding to a layer of the tile; and
   calculating a layer blockage ratio based on the blockage.

4. The method of claim 1, further comprising grouping a first tile layer and a second tile layer based on an equivalence or a proximity of a first layer blockage ratio that corresponds to the first tile layer and a second layer blockage ratio that corresponds to the second tile layer.

5. The method of claim 1, further comprising formulating all remaining segments of the plurality of segments of the piece-wise linear formula.

6. The method of claim 1, further comprising distributing a portion of the number of wires to a layer of the tile based on the tile congestion.

7. The method of claim 1, further comprising formulating a piece-wise linear formula that relates a constraint congestion to a number of constrained wires of a two-dimensional tile.

8. The method of claim 1, wherein a first segment of the plurality of segments extends from greater than zero through a first boundary point, a second segment of the plurality of segments extends from greater than the first boundary point through a second boundary point, and a third segment extends from greater than the second boundary point to the upper boundary of the formula.

* * * * *